United States Patent [19]

Stoll et al.

[11] Patent Number: 4,552,783

[45] Date of Patent: Nov. 12, 1985

[54] ENHANCING THE SELECTIVITY OF TUNGSTEN DEPOSITION ON CONDUCTOR AND SEMICONDUCTOR SURFACES

[75] Inventors: Robert W. Stoll, Schenectady; Michael R. MacLaury, Rexford; Ronald H. Wilson, Schenectady, all of N.Y.

[73] Assignee: General Electric Company, Schenectady, N.Y.

[21] Appl. No.: 668,454

[22] Filed: Nov. 5, 1984

[51] Int. Cl.$^4$ .................. H01L 21/285; H01L 21/302
[52] U.S. Cl. ......................................... 427/91; 134/2; 134/3; 427/82
[58] Field of Search ..................... 427/91, 82; 134/2, 3

[56] References Cited

U.S. PATENT DOCUMENTS

| | | | |
|---|---|---|---|
| 3,988,256 | 10/1976 | Vander Mey | 427/82 |
| 4,075,367 | 2/1978 | Gulett | 134/2 |
| 4,159,917 | 7/1979 | Gluck | 134/3 |
| 4,264,374 | 4/1981 | Beyer | 134/3 |
| 4,308,089 | 12/1981 | Iida | 134/3 |
| 4,349,408 | 9/1982 | Tarng | 427/91 |
| 4,380,490 | 4/1983 | Aspnes | 134/3 |
| 4,404,235 | 9/1983 | Tarng | 427/91 |
| 4,426,311 | 1/1984 | Vander Mey | 134/3 |
| 4,517,225 | 5/1985 | Broadbent | 427/91 |

OTHER PUBLICATIONS

Saraswat et al., Selective CVD of Tungsten for VLSI Technology, Stanford University, May 1984, 1–6.
Werner Kern, Purifying Si and SiO$_2$ Surfaces With Hydrogen Peroxide, Semiconductor International, Apr. 1984, 94–99.

Primary Examiner—John D. Smith
Attorney, Agent, or Firm—Richard J. Traverso; James C. Davis, Jr.; James Magee, Jr.

[57] ABSTRACT

A method is provided for selectively depositing tungsten metal at thicknesses over 1000 angstroms or more on silicon and other conductor and semiconductor surfaces, wherein a substrate containing such surfaces is exposed to a chlorine or bromine containing solution to prevent deposition of tungsten on the insulator surfaces.

20 Claims, No Drawings

ENHANCING THE SELECTIVITY OF TUNGSTEN DEPOSITION ON CONDUCTOR AND SEMICONDUCTOR SURFACES

BACKGROUND OF THE INVENTION

The present invention relates generally to the formation of tungsten metal films on substrates. More particularly, it relates to the selective formation of tungsten metal films on conductive and semiconductive surfaces of a patterned substrate.

There is a continuous trend in the development of solid state circuitry to reduce the dimensions of devices in integrated circuits and in this way increase the speed of operation. As the dimensions of devices on substrates such as silicon wafers continue to shrink, the opening in insulating layers between conductors and semiconductors becomes smaller and the lateral dimensions approach the dimension normal to the silicon surface, thus requiring steep sides to accommodate close packing and achieve the high density required. Coverage of the steep sides by the succeeding conductor becomes difficult and the recessed surface makes lithography for subsequent layers difficult.

A need is recognized for improvement in formation of conductive films on these close packed silicon wafers. A method of avoiding this problem would be to grow a metal selectively on the conductor and semiconductor surfaces. Chemical vapor deposition of tungsten on such surfaces would be a suitable method for accomplishing this goal. The reaction of tungsten hexafluoride with silicon is inherently selective but self limiting because the deposited tungsten film eventually covers all of the silicon, leaving a film of only 100 to 400 angstroms of tungsten. To deposit thicker films of tungsten one must use hydrogen to reduce tungsten hexafluoride and means must be found to prevent tungsten deposition where not desired.

Preventing the growth of tungsten on insulator surfaces has been a problem when attempting to grow thick films of tungsten selectively on conductor and semiconductor surfaces, as disclosed by Saraswat et al. in *Selective CVD of Tungsten for VLSI Technology*, Stanford University, May 1984. Where chemical vapor deposition methods are employed, the problem relates particularly to the nucleation and growth of tungsten on the insulator surfaces after approximately 1000 angstroms of tungsten growth on the conductor surfaces. The selectivity of tungsten vapor deposition has been found to be dependent upon many process conditions including temperature, pressure and reactant concentration. It is desirable to enhance the selectivity of tungsten vapor deposition under all process conditions.

SUMMARY OF THE INVENTION

This invention provides a method for enhancing selective vapor deposition of tungsten on conductor and semiconductor surfaces of a substrate. Such method comprises contacting the substrate with a hydrogen fluoride solution, removing substantially all of said hydrogen fluoride solution from said substrate and contacting the substrate with a halogen containing solution, said halogen being selected from the group consisting of chlorine and bromine. This invention also provides a method for selectively depositing 1000 angstroms or more of tungsten metal on the conductor and semiconductor surfaces of a substrate, said method comprising treating the surface of said substrate with a hydrogen fluoride solution, removing substantially all of said hydrogen fluoride solution from said substrate, contacting the substrate with a halogen containing solution said halogen being selected from the group consisting of chlorine and bromine and vapor depositing tungsten with a gas mixture of tungsten hexafluoride and hydrogen at a temperature within the range of 200°–350° C.

OBJECTS OF THE INVENTION

An object of the present invention is to inhibit the nucleation and growth of tungsten on insulator surfaces.

Another object of the present invention is to enhance the selectivity of tungsten vapor deposition on conductor and semiconductor surfaces under all process conditions for vapor deposition.

Another object of the present invention is to provide a method by which tungsten may be selectively vapor deposited on patterned semiconductor and conductor surfaces of a substrate at a thickness above 1000 angstroms.

Other objects will be apparent from the detailed descriptions which follows.

DETAILED DESCRIPTION OF THE INVENTION

The method for inhibiting tungsten growth on insulated surfaces provided by this invention is essentially a surface preparation procedure for a substrate. Suitable substrates are those which contain conductor and/or semiconductor surfaces. Suitable conductor surfaces are those provided by metals and alloys thereof including, for example, platinum, molybdenum, titanium, tungsten, tantalum and the like, including mixtures thereof. Other suitable conductors include transition metal silicides, such as tungsten silicide, molybdenum silicide, titanium silicide, tantalum silicide, platinum silicide, and the like. Suitable semiconductor surfaces are those provided by silicon. This process demonstrates distinct advantages where the substrates contain patterned semiconductor surfaces on which selective tungsten deposition is desired.

The term "insulator" as used herein, refers to silicon nitrides ($Si_3N_4$), silicon oxynitrides ($Si_xN_yO_z$) and silicon oxides, such as silicon dioxide ($SiO_2$) and certain silicon rich and silicon poor "silicon dioxides" which exhibit Si:O ratios which deviate from 1:2. These silicon oxides are obtained by plasma deposition or low pressure chemical vapor deposition of silicon and oxygen or thermal oxidation of silicon. These are typically characterized by a refractive index value since the deviation from the $SiO_2$ stoichiometry is difficult to express. Silicon oxides having a refractive index value of from 1.45–1.51 are within the scope of the term "insulator" as used herein. The silicon oxynitrides and silicon nitrides can also be characterized by a refractive index value; however, the scope of the term "insulator" includes all silicon nitrides and silicon oxynitrides, without regard to the value for the refractive index. The most preferred substrates are the patterned silicon wafers used to form integrated circuits. The insulator surfaces on such wafers are typically provided by silicon dioxide and the semiconductor surfaces are provided by silicon, which can be polycrystalline or monocrystalline.

Enhancing selective vapor deposition of tungsten on conductor and semiconductor surfaces involves contacting the substrate with a hydrogen fluoride solution so as to react any oxides which develop on the conductor and semiconductor surfaces and expose a true conductor or semiconductor surface. The concentration of the hydrogen fluoride solution can range from about 0.05% to 50% by weight water to achieve removal of the oxides. Temperatures at which this hydrogen fluoride wash takes place preferably fall within the range of from about 0° C. to about 45° C. The hydrogen fluoride may etch the insulator material from the substrate after removal of oxides from the conductor surfaces. Therefore, it is preferable to utilize dilute solutions of hydrogen fluoride, i.e., between about 0.5 to 2 weight percent HF, at room temperature to minimize the loss of insulator material. It is also preferable to limit the exposure of hydrogen fluoride to the substrate within the range of from 10 to 60 seconds, with an exposure of 20 to 30 seconds being most preferred.

The contact with the hydrogen fluoride solution can be terminated by rinsing the substrate with water, which is preferably deionized water. Washing the substrate with deionized water prevents the formation of residual salts by neutralization with hydrogen fluoride. This wash is preferably accomplished with a minimum exposure to water and air so as to prevent the reformation of oxides on the conductor and semiconductor surfaces. A wash of a duration of from about 5 to 30 seconds is preferred. Multiple washings may serve to minimize the duration of contact with water. The substrates may be dried prior to further processing if desired. This may be undesirable where reformation of the oxide layer on the conductor and semiconductor surfaces is a concern. The wash may be achieved simultaneously with the exposure of the substrate to the halogen containing solution where this solution is aqueous.

Upon removal of the hydrogen fluoride solution from said substrate, the insulator surfaces are exposed to a halogen containing solution, said halogen being selected from the group consisting of chlorine and bromine.

The halogen containing solution can be either aqueous or organic provided a suitable chlorine or bromine-containing species will remain dissolved therein. Suitable chlorine and bromine-containing species include chlorine gas, hydrogen chloride, bromine gas, hydrogen bromide and chlorinated or brominated hydrocarbons, preferably of from 1 to 6 carbon atoms. The chlorinated and brominated hydrocarbons include methylene chloride, methylene bromide, ethylene chloride, propylene chloride, carbon tetrachloride, n-butyl chloride, butyl bromide, chloroform and the like. These chlorinated and brominated hydrocarbons may provide the halogen containing solutions alone or they may be diluted with other organic solvents in which they are soluble.

Exposure of the substrate surfaces to chlorine and bromine containing solutions preferably takes place at a temperature within the range of from 0° C.-200° C. The duration of exposure to the solutions preferably ranges from about 1 to 30 minutes. The concentrations of chlorine- and bromine-containing species in the solutions preferably range from about 0.1-100% by weight of said solute medium. Concentrations which are most preferred for aqueous solutions fall within the range of about 5-40 weight percent of said solvent medium.

When exposure to the chlorine and bromine containing solution is complete, the substrate is preferably washed to remove the halogen-containing solution. Where the bromine- and chlorine-containing species were within an aqueous solvent, water is the preferred solvent for washing the substrate, with the use of deionized water being most preferred. Where the chlorine and bromine species are provided within an organic solution, these species can be removed with a water wash or a wash with an organic solvent in which they are soluble.

Upon removal of substantially all of said halogen-containing solution with the wash, the substrate is preferably dried to remove the washing solution. This can be accomplished by conventional methods, such as spin drying. Once dried, the substrate is prepared for vapor deposition of tungsten. It is preferable to perform the vapor deposition immediately so as to prevent the formation of oxides at the conductor and semiconductor surfaces.

The substrates can be vapor deposited with tungsten in any conventional device suitable for tungsten chemical vapor deposition. Conventional methods for vapor depositing tungsten metal may be used under all processing conditions. The enhancement of selectivity for tungsten deposition at the conductor and semiconductor surfaces provided by this invention is not effected by processing conditions.

The method for selectively depositing tungsten provided by this invention utilizes the surface preparation described above for the substrate and subsequently vapor deposits tungsten with a gas mixture of tungsten hexafluoride and hydrogen within a chemical vapor deposition furnace. A dilution with hydrogen is necessary to reduce the tungsten hexafluoride and provide deposition at the conductor and semiconductor surfaces. The mixtures of tungsten hexafluoride and hydrogen preferably range from 1:3 to 1:1000. The furnace temperature ranges from about 200° C. to 350° C. and the flow rates of tungsten hexafluoride preferably range from about 0.1 to 50 SCCM. Flow rates and gas mixtures within this range will provide 1000 angstroms or more of tungsten in less than 1 hour. This time period will vary as the concentration of hydrogen within the gas mixture varies to provide a pressure of 0.1 to 10 Torr. Those conditions which provide higher deposition rates are preferred. Selective deposition of tungsten metal films above 1000 angstroms on the conductor and semiconductor surfaces is achieved under these conditions without deposition on insulator surfaces. Selective films as thick as 2000 angstroms are expected when vapor depositing tungsten within the preferred ranges for temperature, flow rate, and hydrogen concentration.

An alternative to depositing all the tungsten metal at once is to deposit a film of tungsten metal on the conductor and semiconductor surfaces after the removal of substantially all of said hydrogen fluoride. Films as thick as 500 angstroms may be obtained due to the inherently selective reaction of tungsten and semiconductor surfaces. After vapor deposition of this thin tungsten film, the surface treatment continues with exposing the substrate to chloride or bromide ions, followed by further deposition of tungsten.

The following examples are provided to illustrate particular embodiments of this invention. These examples are not provided with the intention of limiting the scope of this invention to the embodiments disclosed.

EXAMPLE 1

A treated silicon wafer containing insulator surfaces of silicon dioxide and semiconductor surfaces of polycrystalline silicon was exposed to a 1% solution of hydrogen fluoride for 20 seconds, followed by two deionized H₂O rinses and a spin dry. The wafers were then dipped for 5 minutes in boiling concentrated hydrogen chloride (37.5%) followed by two deionized H₂O rinses and a spin dry. The wafers were immediately loaded into a high temperature furnace at a pressure of approximately one-third Torr. A gas mixture of tungsten hexafluoride and hydrogen was passed over the wafers for approximately 1 hour. The mole ratio of tungsten hexafluoride to hydrogen fell within the range of about 1:5. Upon removal from the furnace, the wafer showed no deposition of tungsten on the insulator surfaces and provided a tungsten metal film on the semiconductor surfaces having a thickness greater than 1000 angstroms.

EXAMPLE 2

A silicon wafer containing insulator surfaces provided by a 4000 angstroms layer of silicon dioxide and semiconductor surfaces of silicon exposed through 80 μm holes within the silicon dioxide layer is treated for 20 seconds with a 1% solution of hydrogen fluoride followed by two deionized H₂O rinses and a spin dry. This treated silicon wafer is heated to about 300° C. and a gas mixture of tungsten hexafluoride and hydrogen is passed by the wafer to grow a film of tungsten of approximately 500 angstroms thick. No deposition on the insulator surfaces will result. The silicon wafer is then removed, treated with boiling concentrated hydrogen chloride for 5 minutes, rinsed with deionized water, dried and loaded into a high temperature furnace at a pressure of about 0.5 Torr. A gas mixture of tungsten hexafluoride and hydrogen (mole ratio of 1:5) is passed over the wafer for about 1 hour. Upon removal from the furnace, the insulator surface shows no deposition of tungsten and a film greater than 1000 angstroms of tungsten will be deposited on the silicon semiconductor surface.

EXAMPLE 3

A treated silicon wafer containing insulator surfaces of silicon oxide formed by plasma deposition (refractive index=1.5) and semiconductor surfaces of polycrystalline silicon was exposed to a 1% solution of hydrogen fluoride for 20 seconds, followed by two deionized H₂O rinses and a spin dry. The wafers were then dipped for 3 minutes in boiling concentrated hydrogen chloride (37.5%) followed by two deionized H₂O rinses and a spin dry. The wafers were immediately loaded into a high temperature furnace. A gas mixture of tungsten hexafluoride and hydrogen was passed over the wafers for approximately 90 minutes at about 277° C. at a pressure of 0.53 Torr. The mole ratio of tungsten hexafluoride to hydrogen fell within the range of about 1:60. Upon removal from the furnace, the wafer showed no deposition of tungsten on the insulator surfaces and provided a tungsten metal film on the semiconductor surfaces having a thickness greater than 1000 angstroms.

EXAMPLE 4

A silicon wafer containing insulator surfaces of silicon oxynitride deposited by plasma deposition (refractive index=1.8) and semiconductor surfaces of polycrystalline silicon was treated as described in Example 3. The wafers were immediately loaded into a high temperature furnace and vapor deposited with tungsten as described in Example 3. Upon removal from the furnace, the wafer showed no deposition of tungsten on the insulator surfaces and provided a tungsten metal film on the semiconductor surfaces having a thickness greater than 1000 angstroms.

EXAMPLE 5

A silicon wafer containing insulator surfaces of silicon nitride deposited by plasma deposition (Refractive index=1.99) and semiconductor surfaces of polycrystalline silicon was treated as described in Example 3. The wafers were immediately loaded into a high temperature furnace and deposited with tungsten as described in Example 3. Upon removal from the furnace, the wafer showed no deposition of tungsten on the insulator surfaces and provided a tungsten metal film on the semiconductor surfaces having a thickness greater than 1000 angstroms.

EXAMPLE 6

A silicon wafer containing insulator surfaces of silicon oxide deposited by low pressure chemical vapor deposition (refractive index=1.46) and semiconductor surfaces of polycrystalline silicon was treated as described in Example 3. The wafers were immediately loaded into a high temperature furnace and vapor deposited with tungsten as described in Example 3. Upon removal from the furnace, the wafer showed no deposition of tungsten on the insulator surfaces and provided a tungsten metal film on the semiconductor surfaces having a thickness greater than 1000 angstroms.

EXAMPLE 7

A treated silicon wafer containing insulator surfaces of silicon dioxide and semiconductor surfaces of polycrystalline silicon was exposed to a 1% solution of hydrogen fluoride for 20 seconds, followed by two deionized H₂O rinses and a spin dry. The wafers were then dipped in methylene chloride at room temperature followed by two deionized H₂O rinses and a spin dry. The wafers were immediately loaded into a high temperature furnace and a gas mixture of tungsten hexafluoride and hydrogen was passed over the wafers for approximately 1 hour at about 290° C. The mole ratio of tungsten hexafluoride to hydrogen fell within the range of about 1:30. Upon removal from the furnace, the wafer showed no deposition of tungsten on the insulator surfaces and provided a tungsten metal film on the semiconductor surfaces having a thickness greater than 1000 Angstroms.

What is claimed is:
1. A method for enhancing the selective vapor deposition of tungsten on conductor and semiconductor surfaces of a substrate which contains insulator surfaces, said method comprising
(a) contacting the substrate with a hydrogen fluoride solution;
(b) removal of substantially all of said hydrogen fluoride from said substrate;
(c) contacting the substrate with a halogen containing solution, said halogen being selected from the group consisting of chlorine and bromine; and
(d) removing substantially all of said halogen containing solution from said substrate.

2. A method as in claim 1 wherein the halogen containing solution is a solution of chlorine and bromine containing species selected from the group consisting of hydrogen chloride, hydrogen bromide, chlorine gas, bromine gas, chlorinated hydrocarbons of from 1 to 6 carbon atoms and brominated hydrocarbons of from 1 to 6 carbon atoms.

3. A method as in claim 2 wherein the halogen is chlorine.

4. A method as in claim 3 where in the substrate contains insulator surfaces provided by a member of the group consisting of silicon dioxide, silicon nitride and silicon oxynitride.

5. A method as in claim 4 wherein said substrate is a patterned silicon wafer.

6. A method as in claim 5 wherein the concentration of hydrogen fluoride falls within the range of about 0.05 to 50 weight percent of the aqueous medium.

7. A method as in claim 2 wherein the hydrogen fluoride solution is removed with a rinse of deionized water.

8. A method as in claim 3 wherein the chlorine containing solution is an aqueous solution of a chlorine-containing species selected from the group consisting of chlorine gas and HCl.

9. A method as in claim 3 wherein the chlorine containing solution is an organic solution of a chlorine containing species selected from the group consisting of methylene chloride, ethylene chloride, carbon tetrachloride, propylene chloride, n-butyl chloride, chloroform, hydrogen chloride, hydrogen bromide, chlorine gas and bromine gas.

10. A method as in claim 8 wherein the concentration of chlorine-containing species within said aqueous solution falls within the range of about 0.5 to 50 weight percent.

11. A method as in claim 10 wherein the temperature of said solution is within the range of about 0° C. to 200° C.

12. A method as in claim 8 wherein the chlorine containing solution is removed with a rinse of deionized water.

13. A method as in claim 2 comprising the additional step of vapor depositing tungsten metal at a thickness of about 500 angstroms after removal of substantially all of said hydrogen fluoride from said substrate.

14. A method for selectively depositing 1000 angstroms or more of tungsten metal on the conductor and semiconductor surfaces of a substrate which contains insulator surfaces, said method comprising
(a) contacting the surfaces of said substrate with a hydrogen fluoride solution;
(b) removal of substantially all of said hydrogen fluoride solution;
(c) contacting said substrate with a halogen containing solution, said halogen being selected from the group consisting of chlorine and bromine;
(d) removing substantially all of said halogen containing solution from the surface of said substrate; and
(e) depositing a gas mixture of tungsten hexafluoride and hydrogen on said substrate at a temperature within the range of about 200° C. to 350° C.

15. A method as in claim 14 wherein the halogen containing solution is a solution of chlorine and bromine containing species selected from the group consisting of hydrogen chloride, hydrogen bromide, chlorine gas, bromine gas, chlorinated hydrocarbons of from 1 to 6 carbon atoms and brominated hydrocarbons of from 1 to 6 carbon atoms.

16. A method as in claim 15 wherein the gas mixture is comprised of hydrogen and tungsten hexafluoride in a ratio of about 3:1 to 1000:1 and the flow rate of tungsten hexafluoride is within the range of about 0.1 to 50 SCCM.

17. A method as in claim 15 wherein the deposition of tungsten takes place at a temperature within the range of about 225° C. to 325° C.

18. A method as in claim 15 wherein the substrate contains insulator surfaces provided by silicon dioxide, silicon nitride and silicon oxynitride.

19. A method as in claim 18 wherein the substrate is a patterned silicon wafer.

20. A method as in claim 15 comprising the additional step of depositing tungsten on said substrate at a thickness of about 500 angstroms after removal of substantially all of said hydrogen fluoride solution from said substrate.

* * * * *